(12) United States Patent
Anderson et al.

(10) Patent No.: US 12,342,578 B2
(45) Date of Patent: Jun. 24, 2025

(54) STACKED LAYER MEMORY SUITABLE FOR SRAM AND HAVING A LONG CELL

(71) Applicant: International Business Machines Corporation, Armonk, NY (US)

(72) Inventors: Brent A. Anderson, Jericho, VT (US);
Albert M. Chu, Nashua, NH (US);
Ruilong Xie, Niskayuna, NY (US);
Junli Wang, Slingerlands, NY (US);
Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 467 days.

(21) Appl. No.: 17/991,243

(22) Filed: Nov. 21, 2022

(65) Prior Publication Data

US 2024/0172408 A1    May 23, 2024

(51) Int. Cl.
| | |
|---|---|
| *H10D 30/67* | (2025.01) |
| *H10B 10/00* | (2023.01) |
| *H10D 30/43* | (2025.01) |
| *H10D 30/62* | (2025.01) |
| *H10D 62/10* | (2025.01) |

(52) U.S. Cl.
CPC ......... *H10D 30/6757* (2025.01); *H10B 10/12* (2023.02); *H10D 30/43* (2025.01); *H10D 30/6735* (2025.01); *H10D 62/121* (2025.01); *H10D 30/62* (2025.01)

(58) Field of Classification Search
CPC ............... H10D 30/62; H10D 30/6757; H10D 30/6735; H10D 30/43; H10D 62/121; H10D 30/014; H10B 10/12; H10B 10/125; H10B 10/18
See application file for complete search history.

(56) References Cited

U.S. PATENT DOCUMENTS

| | | |
|---|---|---|
| 10,381,068 B2 | 8/2019 | Na et al. |
| 10,418,449 B2 | 9/2019 | Paul et al. |
| 10,818,674 B2 | 10/2020 | Mann et al. |
| 11,164,793 B2 | 11/2021 | Xie et al. |
| 2020/0365464 A1 | 11/2020 | Sreenivasan et al. |
| 2022/0068921 A1* | 3/2022 | Chanemougame .. H10D 84/856 |
| 2022/0102362 A1 | 3/2022 | Chanemougame et al. |
| 2023/0413505 A1* | 12/2023 | Liu ........................ H10D 89/10 |

FOREIGN PATENT DOCUMENTS

CN    113690238 A    11/2021

* cited by examiner

*Primary Examiner* — Changhyun Yi
(74) *Attorney, Agent, or Firm* — Daniel M. Yeates

(57) ABSTRACT

A stacked layer memory for a SRAM includes a first layer of the SRAM, including multiple transistors of a first type, and includes a second layer of the SRAM, having multiple transistors of a second type. The first and second layers are different layers stacked vertically. A width of individual SRAM cells of the stacked layer memory is defined at least by a pitch of a single transistor of the transistors of the first type and the transistors of the second type. A method for forming the stacked layer memory for the SRAM includes forming the first layer and the second layer. The first and second layers are different layers and are formed to be stacked vertically. A width of individual SRAM cells of the stacked layer memory is defined at least by a pitch of a single transistor of the transistors of the first and second types.

20 Claims, 11 Drawing Sheets

PFET OVERLAPPING
NFET LAYER

STACKED LAYER MEMORY SUITABLE FOR SRAM AND HAVING A LONG CELL

BACKGROUND

This invention generally relates to semiconductors and, more specifically, relates to semiconductor devices with memory having different types of transistors such as SRAM (static random-access memory) cells.

Static random-access memory (SRAM) may be used, for example, to temporarily store data in a computer system. An SRAM device includes an array of bitcells in which each bitcell retains a single bit of data during operation and is able to be programmed with a value for the single bit. Each SRAM bitcell may have a 6-transistor (6T) design that includes a pair of cross-coupled inverters and a pair of access transistors connecting the inverters to complementary bit lines. The two access transistors are controlled by word lines, which are used to select the SRAM memory cell for read or write operations. When continuously powered, the memory state of an SRAM persists without the need for data refresh operations.

The transistors in the SRAM cells may be formed from different semiconductor structures. A fin-type field-effect transistor (FinFET) is a non-planar device structure for a field-effect transistor that may be more densely packed in an integrated circuit than planar field-effect transistors. A FinFET includes a fin, heavily-doped source/drain regions, and a gate electrode that wraps around the fin. During operation, a channel for carrier flow is formed in the fin between the source/drain regions. In comparison with planar field-effect transistors, the arrangement between the gate structure and fin improves control over the channel and reduces the leakage current when the FinFET is in its "Off" state. This, in turn, lowers threshold voltages in comparison with planar field-effect transistors, and results in improved performance and lowered power consumption.

Nanosheet field-effect transistors have been developed as an advanced type of FinFET that may permit additional increases in packing density in an integrated circuit. The body of a nanosheet field-effect transistor includes multiple nanosheet channel layers vertically stacked in a three-dimensional array. Sections of a gate stack may surround all sides of the individual nanosheet channel layers in a gate-all-around arrangement. The nanosheet channel layers are initially arranged in a layer stack with sacrificial layers composed of a material (e.g., silicon-germanium) that can be etched selectively to the material (e.g., silicon) constituting the nanosheet channel layers. The sacrificial layers are etched and removed in order to release the nanosheet channel layers, and to provide spaces for the formation of the gate stack.

A nanosheet field-effect transistor may be used as a base structure to form a complementary field-effect transistor. The source/drain regions of a nanosheet field-effect transistor may be epitaxially grown from the side surfaces of the nanosheet channel layers in spaces between adjacent layer stacks in an array of layer stacks. In a complementary field-effect transistor, epitaxial semiconductor layers of different conductivity type are grown with a stacked arrangement to provide source/drain regions for forming n-type and p-type field-effect transistors connected with each layer stack of nanosheet channel layers.

Improved structures and SRAM bitcells including complementary field effect transistors and methods of forming such structures and bitcells could be used.

SUMMARY

This section is meant to be exemplary and not meant to be limiting.

In an exemplary embodiment, a stacked layer memory for a static random-access memory is described, which comprises a first layer of the static random-access memory, wherein the first layer comprises a plurality of transistors of a first type. The stacked layer memory further comprises a second layer of the static random-access memory. The second layer comprises a plurality of transistors of a second type, and the first and second layers are different layers stacked vertically. A width of individual static random-access memory cells of the stacked layer memory is defined at least by a pitch of a single transistor of the transistors of the first type and the transistors of the second type.

In another exemplary embodiment, a method is disclosed for forming a stacked layer memory for a static random-access memory. The method includes forming a first layer of the static random-access memory, wherein the first layer comprises a plurality of transistors of a first type. The method also includes forming a second layer of the static random-access memory. The second layer comprises a plurality of transistors of a second type, and the first and second layers are different layers and are formed to be stacked vertically. A width of individual static random-access memory cells of the stacked layer memory is defined at least by a pitch of a single transistor of the transistors of the first type and the transistors of the second type.

BRIEF DESCRIPTION OF THE SEVERAL VIEWS OF THE DRAWINGS

FIGS. 4-1 and 4-2, illustrates a schematic top view of a stacked long cell nanosheet SRAM for two cells;

Figures 1, 4:
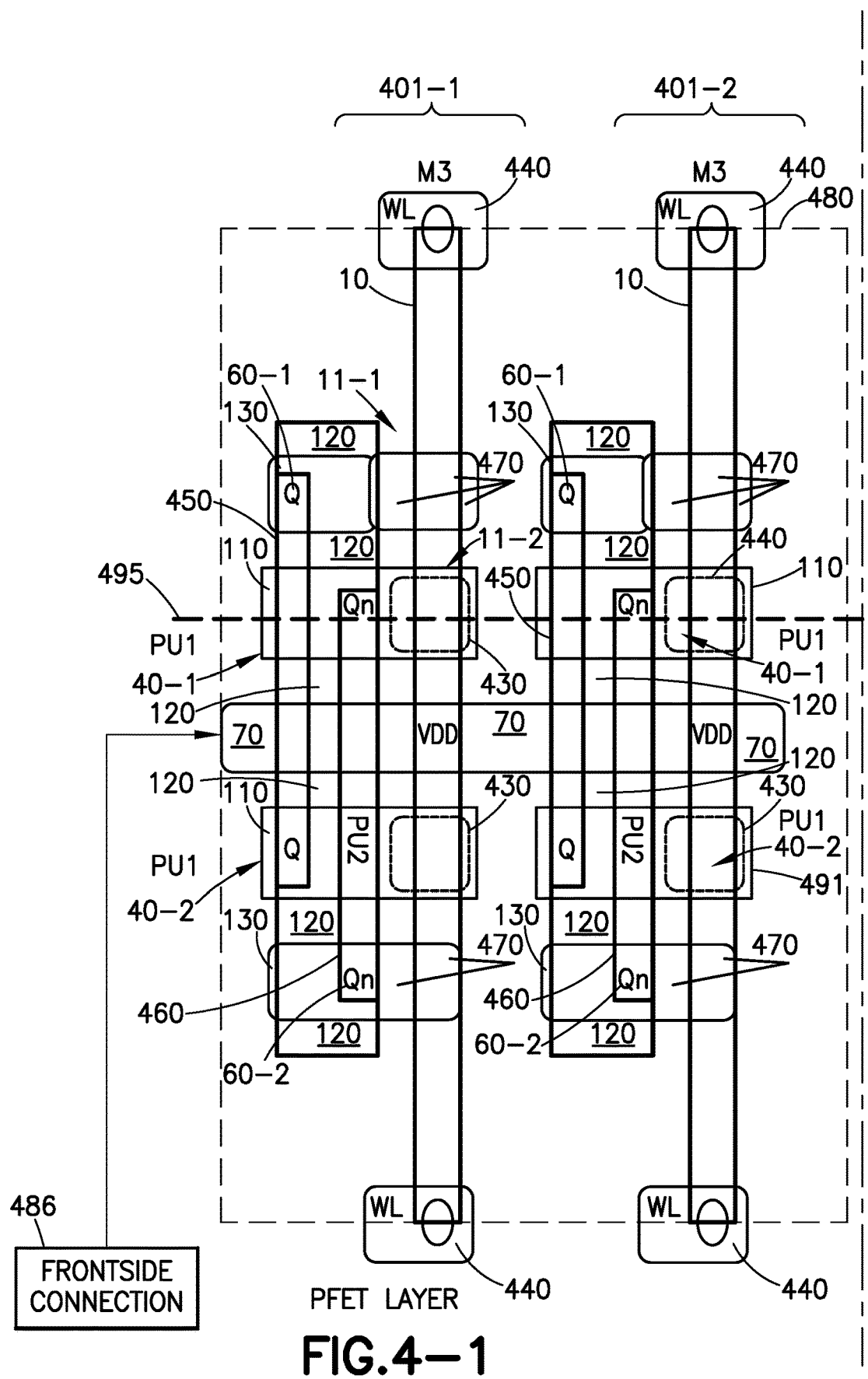
FIG. 4, spread over
Figures 2, 4:
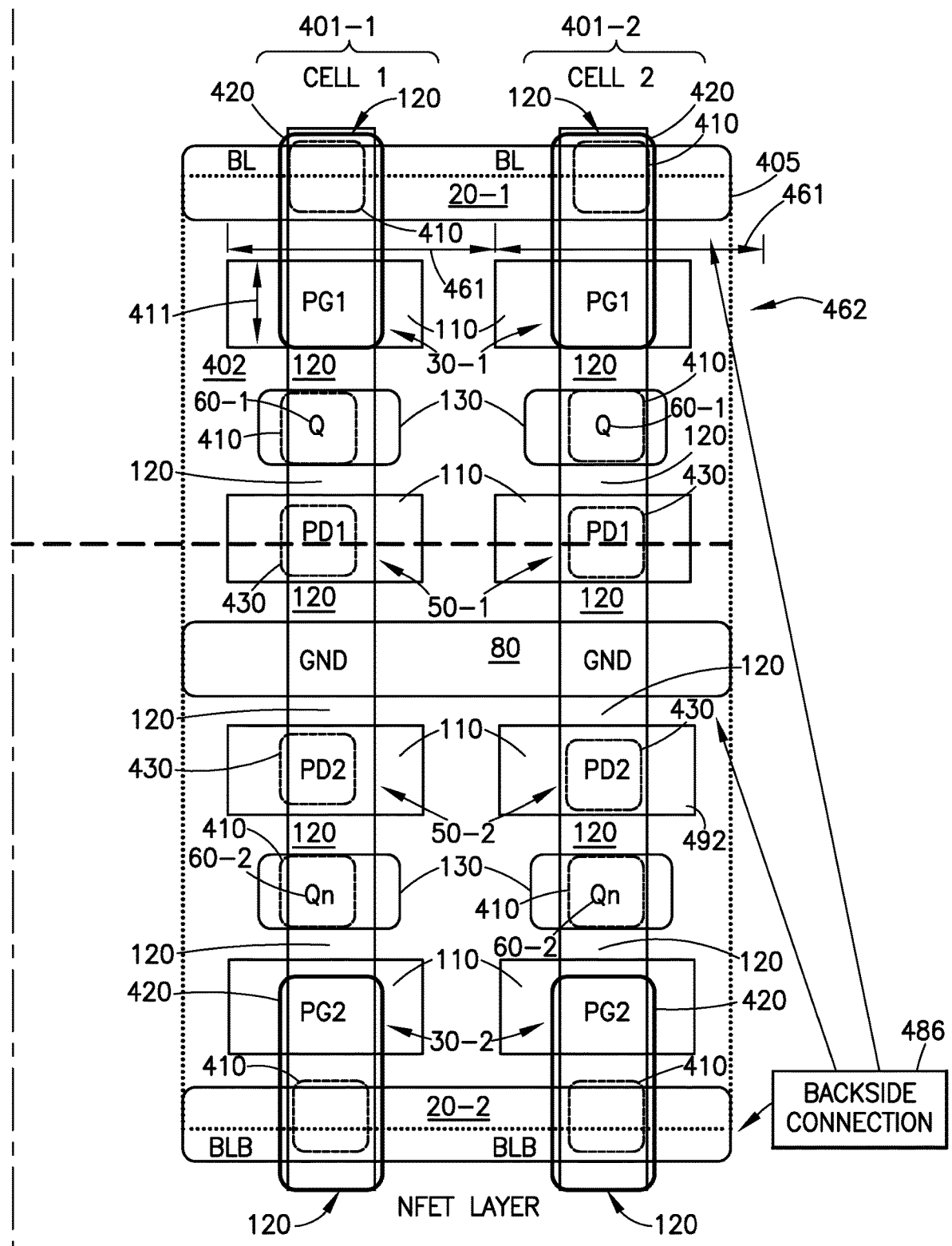
Figure 6:
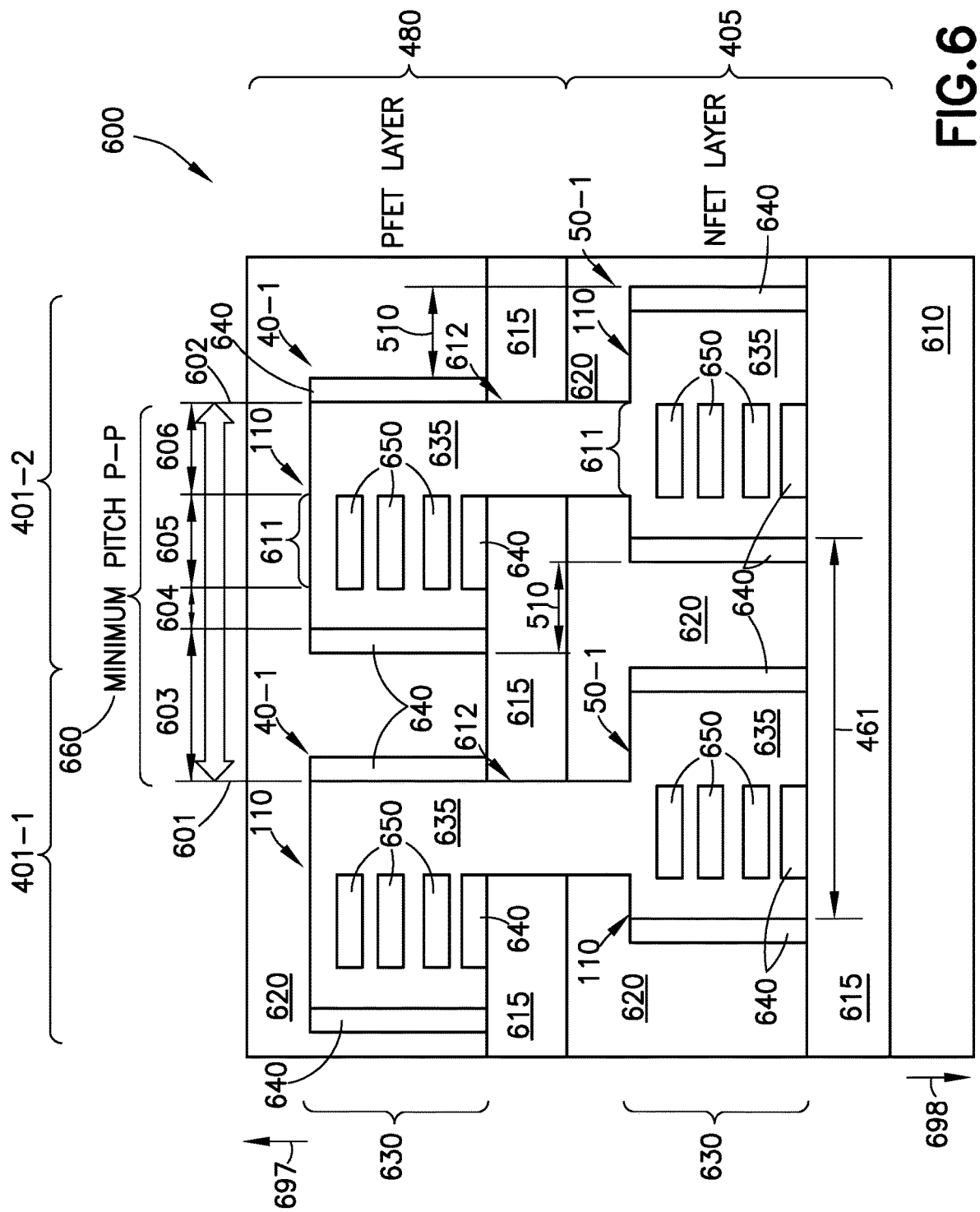
Figure 7:
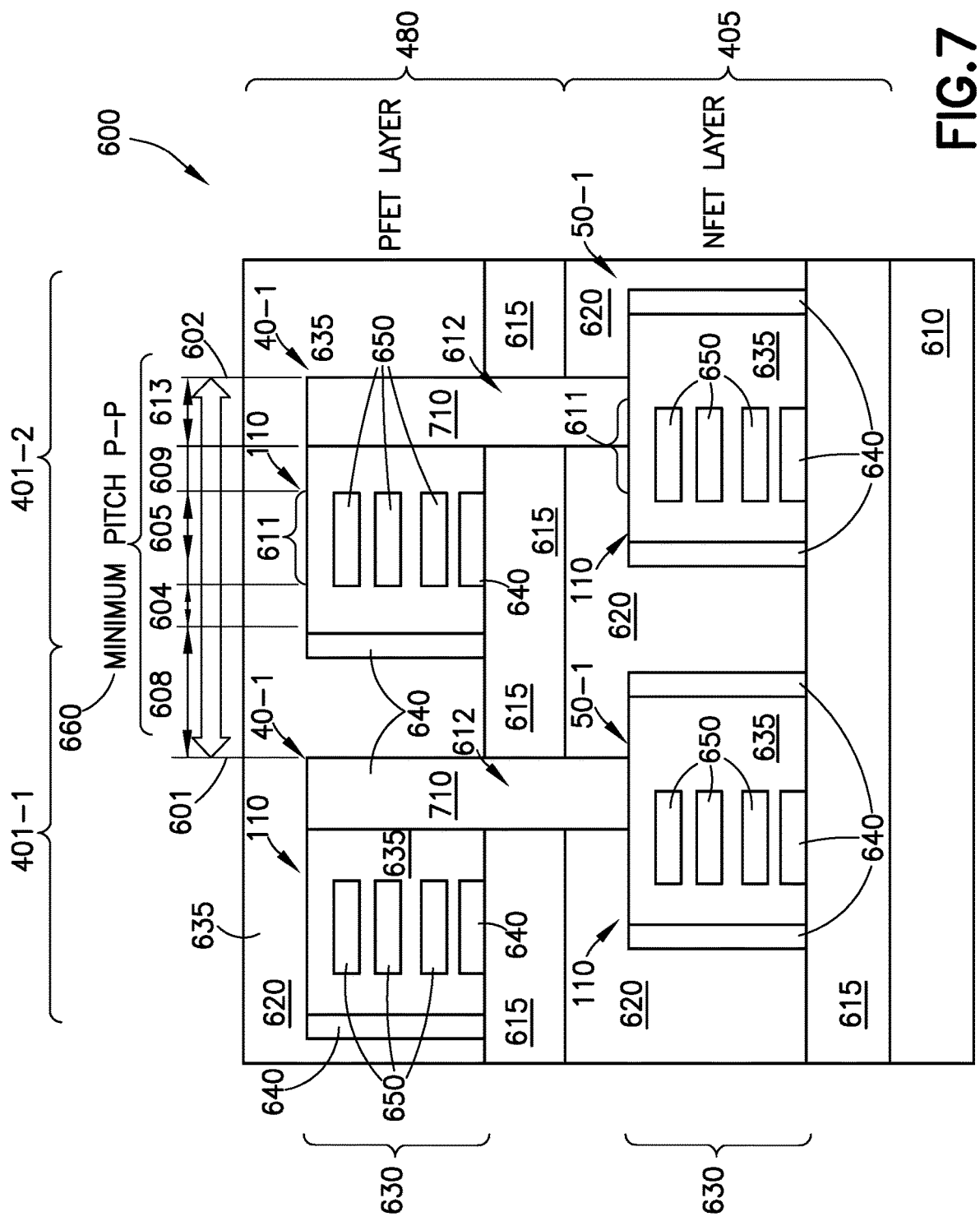
Figure 8:
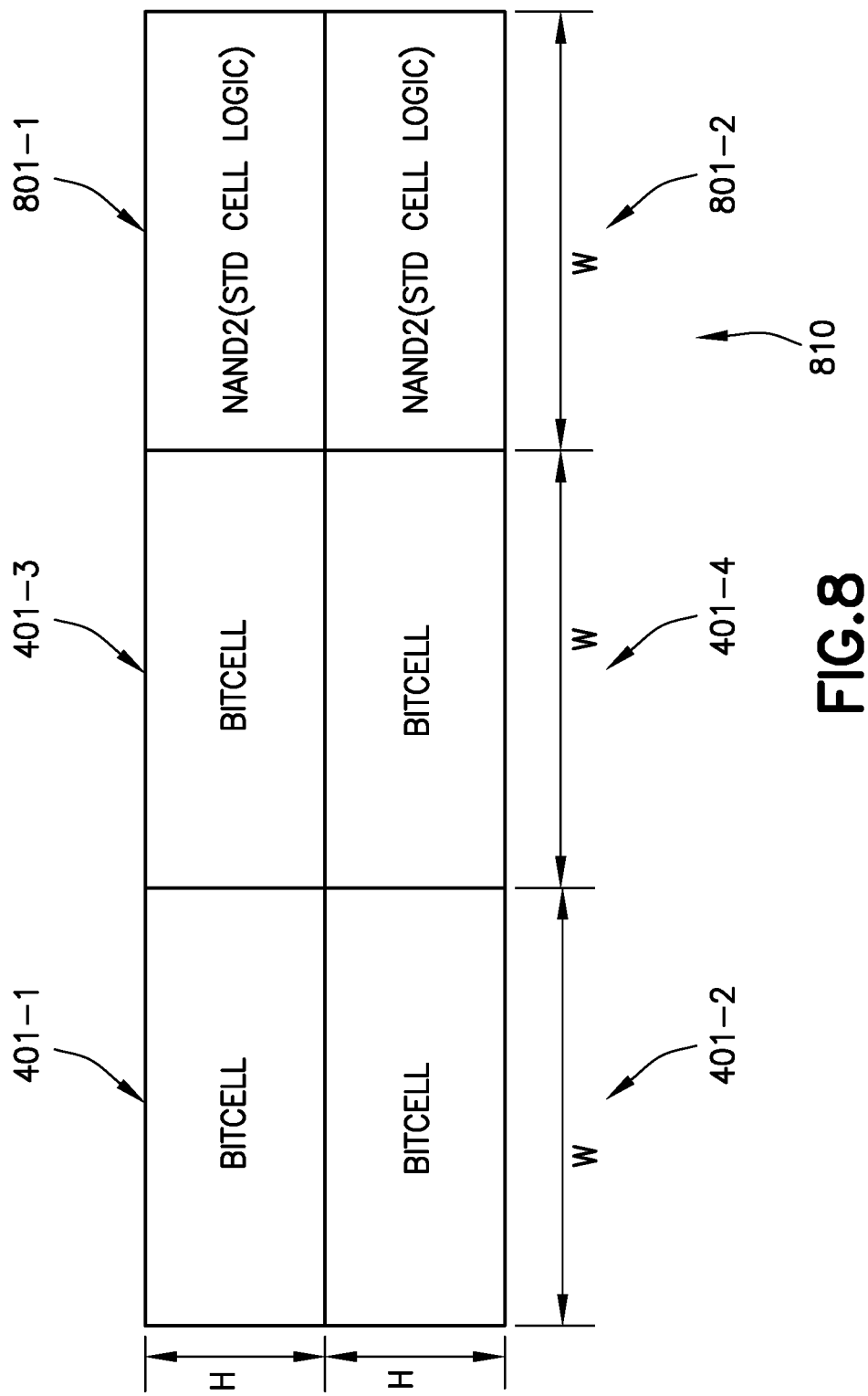

Each of FIGS. 6 and 7 illustrate a cross-section of the stacked long cell nanosheet SRAM, where the cross-section is indicated by a reference line in FIG. 4;

FIG. 8 illustrates an intermixing of bitcells with logic standard cells; and

Figure 9A:
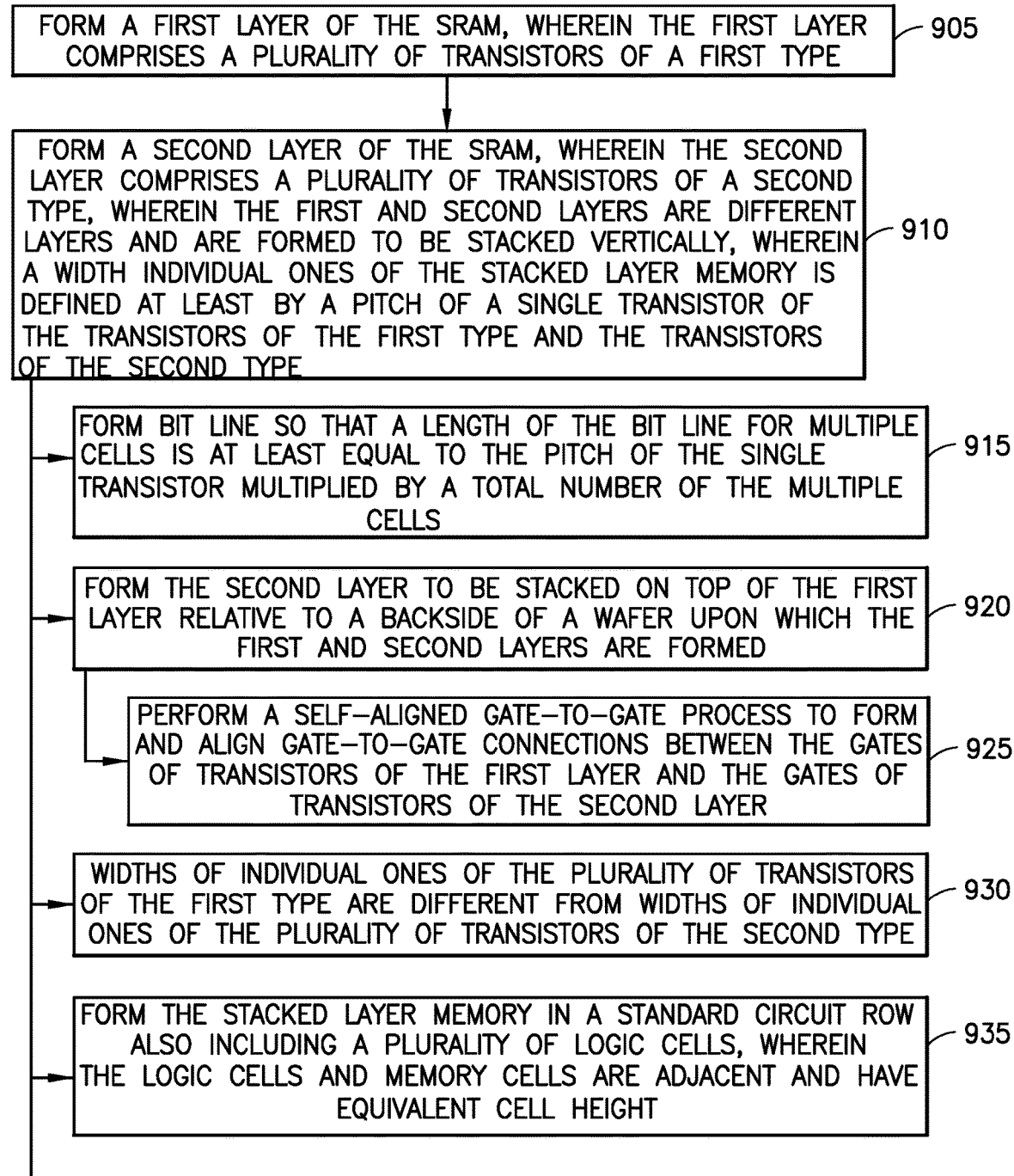
Figure 9B:
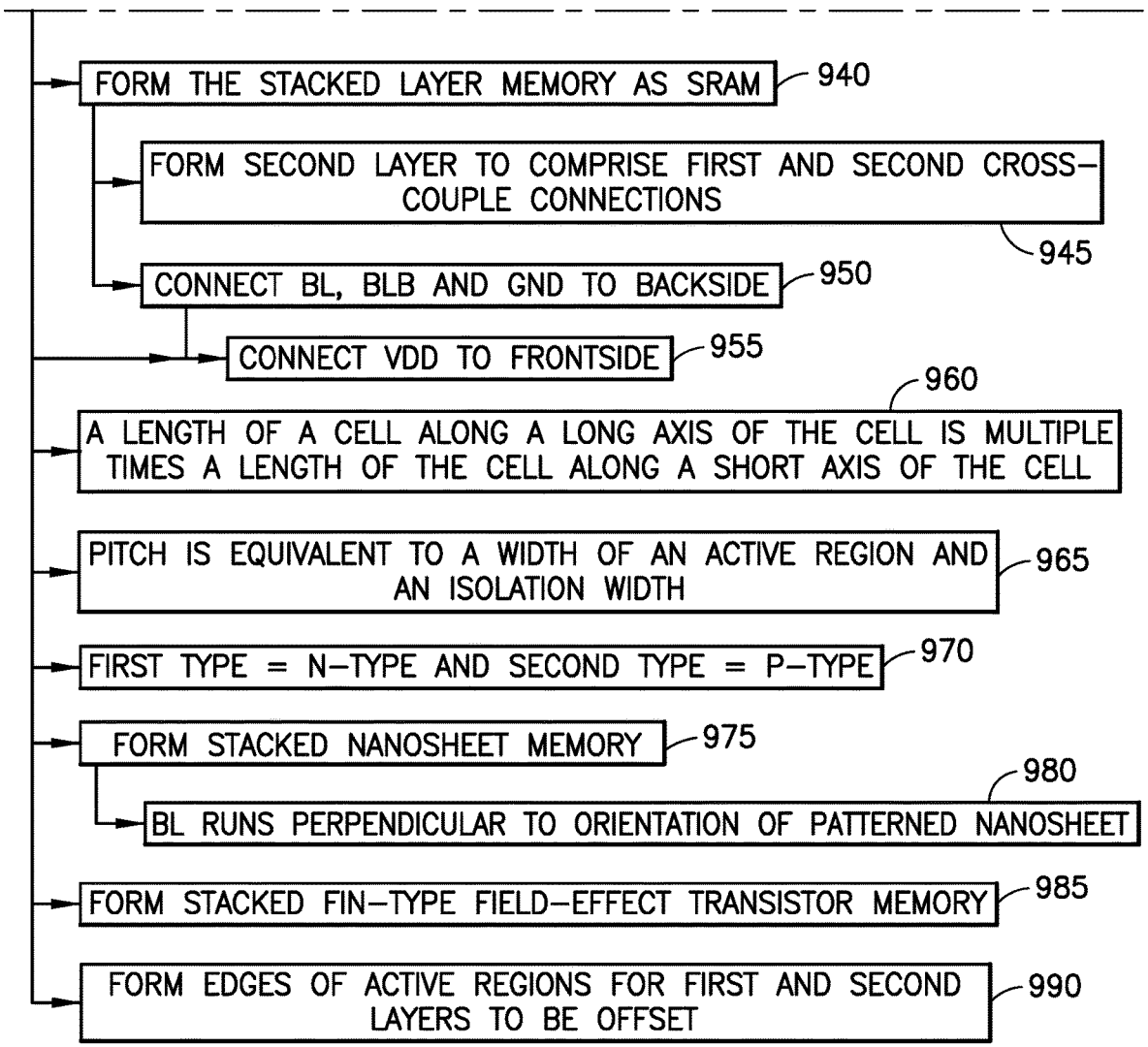

FIG. 9, spread over FIGS. 9A and 9B, is a flowchart of a method for forming a stacked layer memory.

DETAILED DESCRIPTION

Abbreviations that may be found in the specification and/or the drawing figures are defined below, at the end of the detailed description section.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Figure 1:
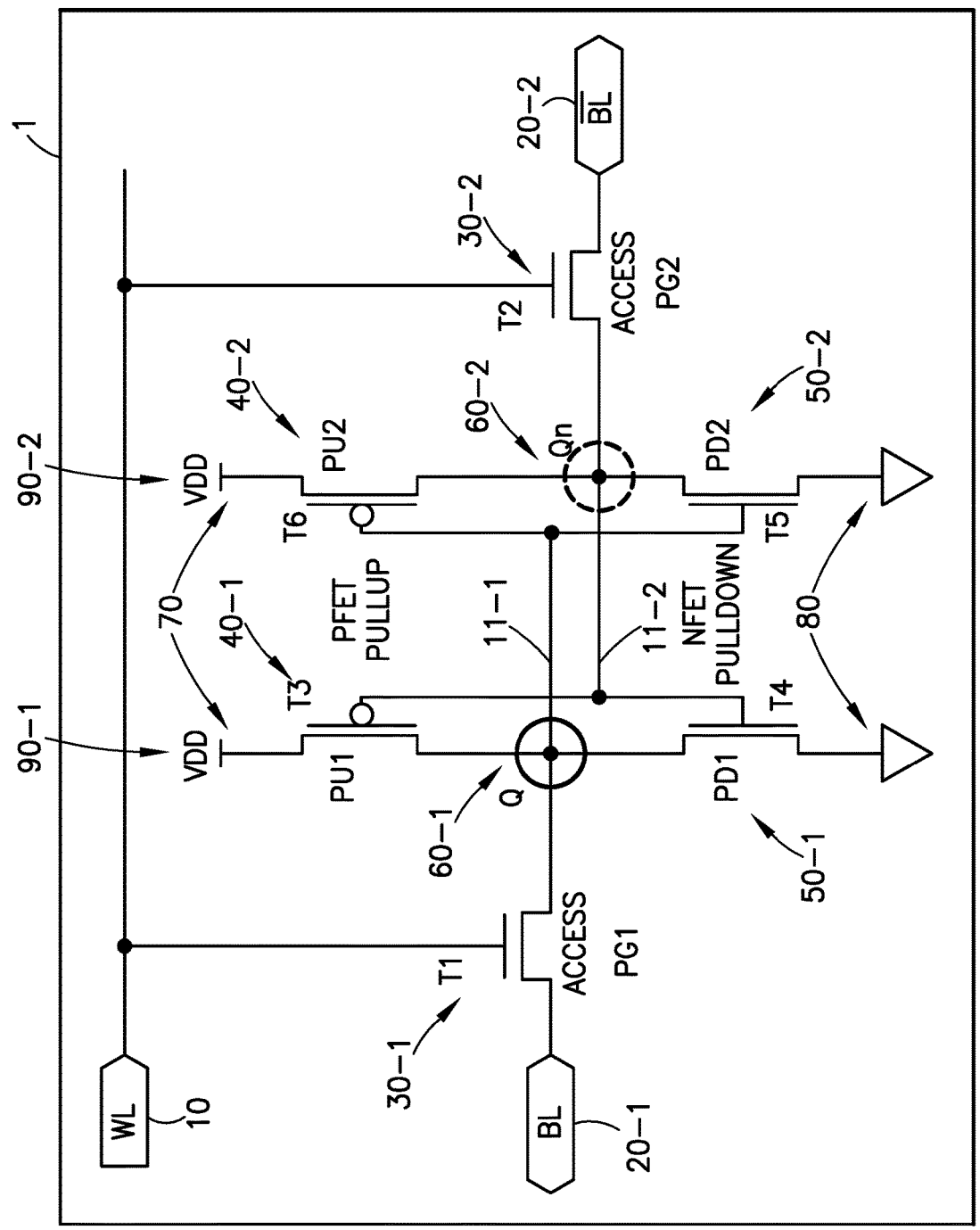
FIG. 1 is a circuit diagram of an SRAM cell.

FIG. 1 is a circuit diagram of an SRAM cell 1, which is a six-transistor (6T) cell. The six transistors are as follows: T1, an access (or pass gate, PG) transistor PG1 30-1; T2, an access transistor PG2 30-2; T3, a pullup (PU) transistor PU1 40-1; T4, a pulldown (PD) transistor PD1 50-1; T5, a PD transistor PD2 50-2; and T6, a PU transistor PU2 40-2. S/Ds of the transistors PU1 40-1 and PU2 40-2 are connected to power (VDD) line 70, the other S/D of transistor PU1 40-1 is connected to Q 60-1, and the other S/D of transistor PU2 40-2 is connected to Qn 60-2. The point Q 60-1 is connected to gates of transistors PU2 40-2 and PD2 50-2, and to a S/D of transistors PD1 50-1, PG1 30-1, and PU1 40-1. The point Qn 60-2 is connected to gates of transistors PU1 40-1 and PD1 50-1, and to a S/D of transistors PD2 50-2, PG2 30-2, and PU2 40-2. The other S/Ds of PD transistors 50-1 and 50-2 are connected to ground VSS line 80. The transistor PG1 30-1 has S/Ds coupled to Q 60-1 and a bit line (BL) 20-1. The transistor PG2 30-2 has S/Ds coupled to Qn 60-2 and a bit line ($\overline{BL}$) 20-2. Reference 11-1 indicates a cross-couple connection from point Q 60-1 to the gates for both transistors PU2 40-2 and PD2 50-2, and reference 11-2 indicates a cross-couple connection from Qn 60-2 to the gates for both transistors PU1 40-1 and PD1 50-1.

The PU transistors PU1 40-1 and PU2 40-2 are PFETs, while the PD transistors PD1 50-1 and PD2 50-2 are pulldown transistors and are NFETs, as are PG1 30-1 and PG2 30-2. The transistors PU1 40-1 and PD1 50-1 form a complementary FET 90-1, while the transistors PU1 40-2 and PD1 50-2 form a complementary FET 90-2.

As used herein, the term "source/drain region", "S/D region", or just "S/D" means a doped region of semiconductor material that can function as either a source or a drain of a transistor (either nanosheet FET or FinFET).

Figure 2:
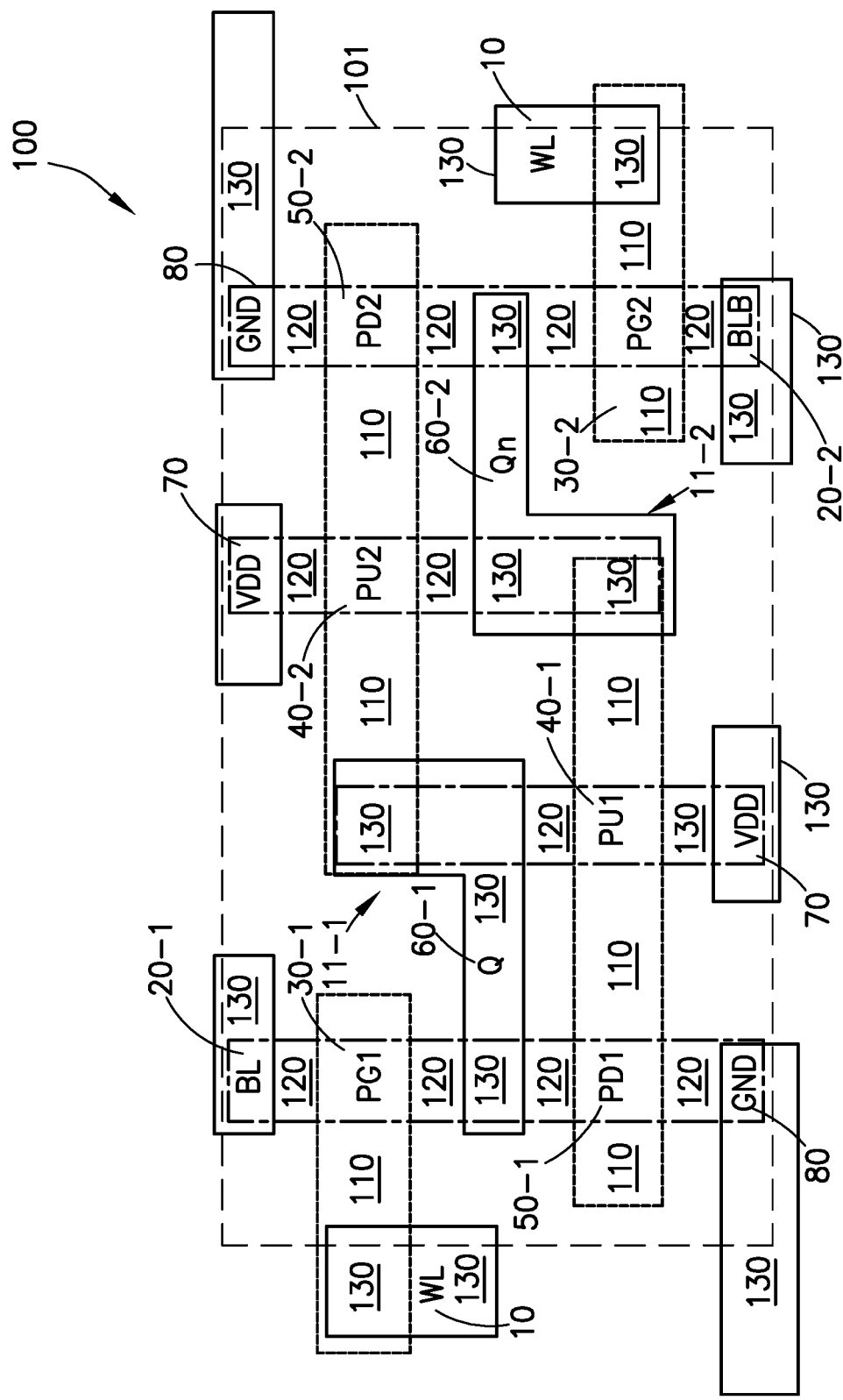
FIG. 2 is a top view of a semiconductor implementation of the SRAM cell in FIG. 1.

Referring to FIG. 2, this figure is a top view of a semiconductor implementation of the SRAM cell in FIG. 1. This shows possible layout at a particular phase of processing of the semiconductor 100 and shows multiple layers that overlap each other. The cell 101 has a layout as indicated, where locations of each of the six transistors 30-1, 30-2, 40-1, 40-2, 50-1, and 50-2 are indicated, as are the word line WL 10, the two points Q 60-1 and Qn 60-2, and the bit line BL and its inverse bit line, BLB. It is noted that BLB is equivalent to $\overline{BL}$. Reference 110 illustrates gate regions, which formed are at the lowest level of the semiconductor 100, relative to the levels at which references 120 and 130 are formed. Reference 120 indicates S/D regions, and is formed at a level above the level at which the gate regions 110 are formed. Reference 130 indicates conductive material areas used to support the word lines 10, bit lines 20, cross-couple connections 11, ground (GND) VSS line 80, and power (VDD) line 70, and is at the highest level (a top level, e.g., of wiring) of the semiconductor 100 in this particular view.

Figure 3:
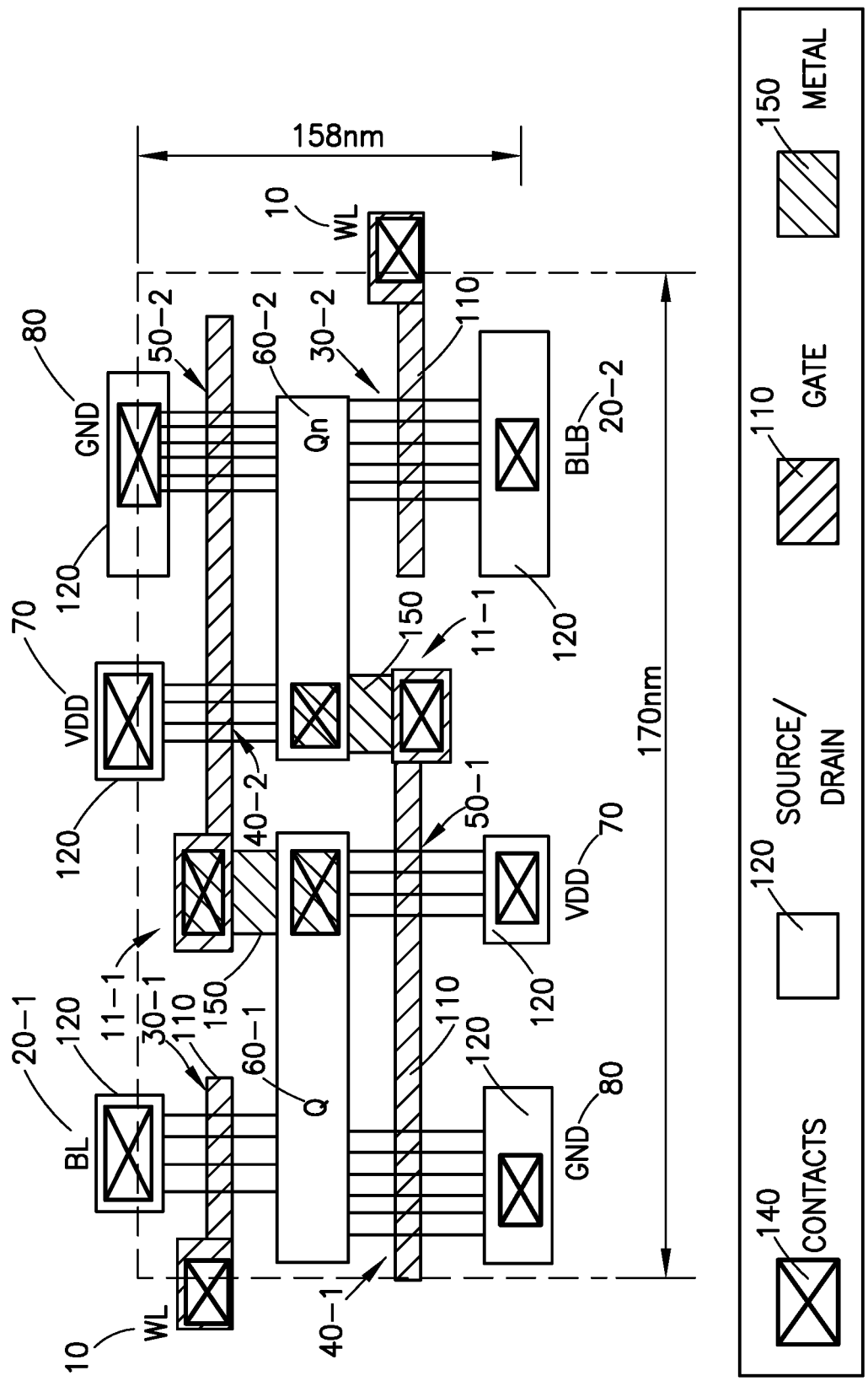
FIG. 3 is a schematic top view illustrating a conductive (e.g., routing) layer that is positioned on top of the view shown in FIG. 2.

FIG. 3 is a diagrammatic top view illustrating a conductive (e.g., routing) layer that is positioned on top the view shown in FIG. 2. Locations for structure of the transistors 30-1, 30-2, 40-1, 40-2, 50-1, and 50-2 are marked. Gate regions 110, S/D regions 120, contacts 140, and metal 150 are shown. The cross-couple connections 11-1 and 11-2 are shown, too. The multiple lines between elements indicate a number of FinFets: e.g., the four lines from BL 20-1 to Q 60-1 are indicating (2) FinFETs, and the six lines between the ground (GND) VSS line 80 and Q 60-1 are indicating (3) FinFETs. For nanosheets, this would be the same number of lines (single wide NS), the but the width can be different between BL or GND connection if desired. An example width in a horizontal direction of 170 nm and a height in a vertical direction of 158 nm are shown in FIG. 3.

This structure, however, can be improved. The examples here provide improvements and stacked nanosheet SRAMs (which are optional for FINFET too). These include NFET on one layer and PFET on a separate layer. Further, the SRAM cell width is defined by a single FET pitch, which is based on a device's active region and isolation width of the device.

Additionally, the following are other examples:
1) An SRAM cell can be intermixed with logic cells in a standard circuit row without an interface gap;
2) A bit line length may be equal to a FET pitch multiplied by the number of cells;
3) NFET may be formed on a bottom layer and PFET formed on a top layer;
4) NFET and PFET device edges can be offset in a relative position;
5) NFET and PFET device widths can be different;
6) SRAM cross-couple connections may be on a top layer;
7) A bit line may run perpendicular to the patterned portions (e.g., the channel regions) of the nanosheet;
8) Self aligned gate-to-gate connections and corresponding processes may be used;
9) BL/BLB/GND connections may be made to the backside of the wafer; and/or
10) A VDD connection may be made to the frontside of the wafer.

Benefits and advantages include one or more of the following:
1) There is a very uniform and low complexity on the NFET layer, which may allow for improved density, e.g., by reducing device side-to-side pitch;
2) BL length (e.g., capacitance) may be reduced by −40-50 percent; e.g., due to the cell width being a single FET pitch;
3) Memory cells can be integrated with logic cells, due to a single FET width cell (e.g., a memory array may be embedded);
4) Cross-couple connections 11 may be formed at a top level in an early wiring stage such as being made at PFET level with standard line and via at a relaxed wiring pitch; and/or
5) BL/BLB/GND connections may be made from the backside, which allows very good FET access and low-resistance wiring and connections.

Referring to FIG. 4, which is spread over FIGS. 4-1 and 4-2, this figure illustrates a schematic top view of a stacked long cell nanosheet SRAM for two cells 401-1 and 401-2. Reference 405 on the right side indicates a lower layer (an NFET layer, e.g., a bottom layer) of the part of the semiconductor wafer that forms the stacked long cell nanosheet SRAM, while reference 480 on the left side indicates an upper layer (a PFET layer, e.g., a top layer) above the NFET layer. Reference 495 shows a line where a cross-section is shown in FIGS. 6 and 7. While most of the description herein assumes the PFET layer 480 is an upper layer relative to the lower NFET layer 405, this could also be reversed, and the PFET layer 480 could be a lower layer.

The NFET layer 405 has the NFETs: pass gate transistors PG1 30-1 and PG2 30-2; and pull down transistors PD1 50-1 and PD 50-2. A semiconductor wafer 402 is illustrated, and the layers shown are formed on top of or partly within that wafer. Reference 411 indicates the orientation of the patterned portions of the nanosheet, in particular the channel regions. The BL 20-1 and BLB 20-2 in this example run perpendicular to reference 411 and therefore perpendicular to the patterned portions of the nanosheet.

The BL 20-1, ground (GND) VSS line 80 and BLB 20-2 can be at the lowest layer 405, and in fact be connected to backside connections, as indicated by reference 485, although this is not a requirement. References 410 indicate vias from the upper layer 480. References 110 indicate gate regions, and references 120 indicate S/D regions. Reference 486 indicates a connection to power (VDD) line 70 may be made to the frontside of the wafer.

For ease of exposition, this will be described in reference to FIG. 1 also. In FIG. 1, there is a path from the BL 20-1, through the pass gate transistor PG1 30-1, through point Q 60-1, and through pull down transistor PD1 50-1 to ground (GND) VSS line 80. For each cell 401-1 and 401-2 in FIG. 4 and in the lower layer 405, there is a path from BL 20-1, through S/D region 120, to the gate region 110 of PG1 30-1 (where part of the gate region 110 and the S/D region 120 is underneath reference 420), through another S/D region 120, past Q 60-1 (and its corresponding conductive material area 130), to another S/D region 120, through gate region 110 of the PD1 50-1, through another S/D region 120, and to ground (GND) VSS line 80.

In FIG. 1, there is a path from the BL 20-2, through the pass gate transistor PG2 30-1, through point Qn 60-2, and through pull down transistor PD2 50-2 to ground (GND) VSS line 80. For each cell 401-1 and 401-2 in FIG. 4 and in the lower layer 405, there is a path from BLB 20-2, through S/D region 120, to the gate region 110 of PG2 30-2 (where part of the gate region 110 and the S/D region 120 is underneath reference 420), through another S/D region 120, past Qn 60-2 (and its corresponding conductive material area 130), to another S/D region 120, through gate region 110 of the PD2 50-2, through another S/D region 120, and to ground (GND) VSS line 80.

Regions 420 have conductive material to connect the vias 410 (and the WLs 10 and corresponding contact regions 440 in upper layer 480) to corresponding pass gate transistors. These correspond to the WL 10 being coupled to the gates of PG1 30-1 and PG2 30-2 in FIG. 1. For instance, in FIG. 4, the regions 420 connect corresponding vias 410 to the gate regions 110 of the PG1 30-1 for cells 401-1 and 401-2. Similarly, the regions 420 connect corresponding vias 410 to the gate regions 110 of the PG2 30-2 for cells 401-1 and 401-2. The word lines 10 are also shown, extending from edge-to-edge for the cells 401.

With respect to upper layer 480, references 440 indicate the contact regions to the vias 410 to contact the word line 10 with underlying conductive material area 420. In this example, the word lines 10 and the contact regions 440 are on the M3 (third metal) layer, although this is not limiting. In FIG. 1, the VDD (power) line 70 passes through the pull up transistor PU1 to the point Q 60-1. In FIG. 4, for both cells 401-1 and 401-2, the VDD (power) line 70 is coupled to the S/D regions 120, through the PU1 40-1, through other S/D regions 120 and to the point Q 60-1 (and its conductive material area 130). Further, for both cells 401-1 and 401-2, the VDD 70 is coupled to the S/D regions 120, through the PU2 40-2, through other S/D regions 120 and to the point Q 60-1 (and its conductive material area 130).

In this example, the lines 450, 460, and 10 are on upper (e.g., top) layer 480 of the wafer 402, that is, the upper layer of the wafer 402 that is used to define cells 401. A cross-couple connection 11-1 is formed on the upper layer 480 at least by the conductive material areas 130 for Q 60-1 being coupled to contact areas 470. In this example, the conductive material areas 130 for Q 60-1 are coupled to the S/D region 120 for the PU1 40-1, and underlie but electrically connect to the contact areas 470. The contact areas 470 are connected through vias 410 to points Q 60-1 and their corresponding conductive material areas 130 on lower layer 405. The points Q 60-1 on the lower layer 405 are electrically coupled to the S/D regions 120 of the PG1 30-1 and the PD1 50-1. The points Q 60-1 therefore are three-dimensional points existing in both the lower layer 405 and the upper layer 480. The cross-couple connection 11-1 is also connected to the gate regions of PU2 40-2 and PD2 50-2 (see FIG. 1 also), and this is implemented on the upper layer 480 using the lines 450 that are electrically coupled to the gate regions 110 of the PU2 40-2, which are electrically coupled to the gates of PD2 50-2 (on the lower layer 405) using vias 430.

Similar construction may be used for points Qn 60-2 and cross-couple connection 11-2. The cross-couple connection 11-2 is formed on the upper layer 480 at least by the conductive material areas 130 for Qn 60-2 being coupled to contact areas 470. In this example, the conductive material areas 130 for Qn 60-2 are coupled to the S/D region 120 for the PU2 40-2, and underlie but electrically connect to the contact areas 470. The contact areas 470 are connected through vias 410 to points Qn 60-2 and their corresponding conductive material areas 130 on lower layer 405. The points Qn 60-2 on the lower layer 405 are electrically coupled to the S/D regions 120 of the PG2 30-2 and the PD2 50-2. The points Qn 60-2 therefore are three-dimensional points existing in both the lower layer 405 and the upper layer 480. The cross-couple connection 11-2 is also connected to the gate regions of PU1 40-1 and PD1 50-1 (see FIG. 1 also), and this is implemented on the upper layer 480 using the lines 460 that are electrically coupled to the gate regions 110 of the PU1 40-1, which are electrically coupled to the gates of PD1 50-1 (on the lower layer 405) using vias 430.

Concerning the gate regions 110 of the PU1 40-1 (on the upper layer 480) that are electrically coupled to the gates of PD1 50-1 (on the lower layer 405) using vias 430 and corresponding contact regions 440, the gate-to-gate connections may be formed using self-aligned gate-to-gate process.

It is further noted that reference 461 indicates a pitch of a single transistor of an NFET, in this case PG1 30-1, and this pitch 461 is equivalent to a width of a device active region (e.g., the gate region 110) and an isolation width of the device. Although not marked on FIG. 4, there is an isolator (e.g., an insulator or insulators such as $SiO_2$ and/or a dielectric such as SiN) between the active regions. This illustrates that a bit line 20-1 (or BLB 20-2) length may be equal to a pitch 461 of a single transistor multiplied by a total number of cells in a circuit row. This example shows two pitches 461 in a circuit row 462 (containing transistors 30-1 from both cells 401-1 and 401-2) for the two pass gates PG1 30-1 and PG2 30-2, and the BL 20-1 length can be equivalent to twice the pitch 461.

Figure 5:
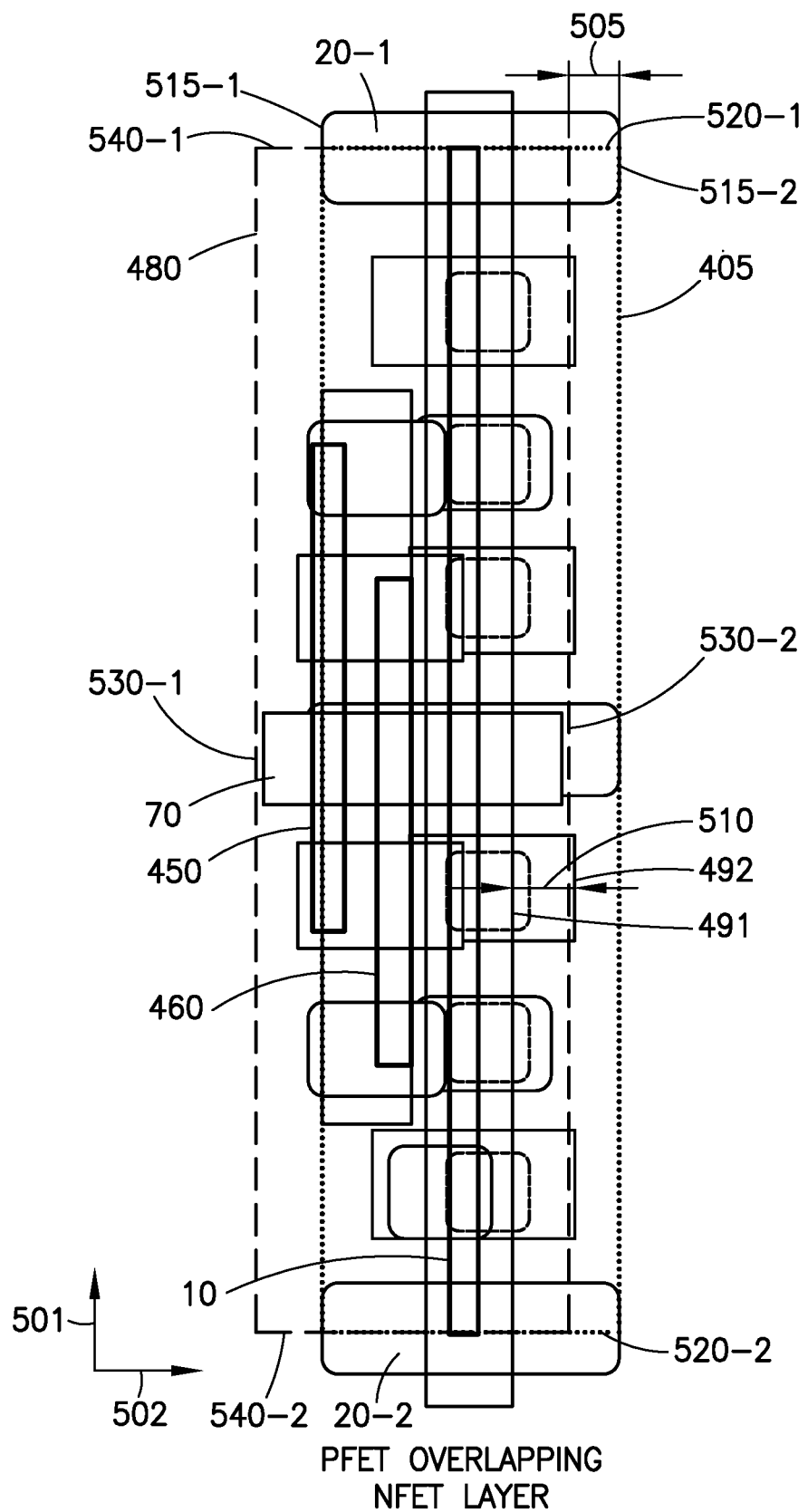
FIG. 5 illustrates an example where the PFET layer overlaps the NFET layer and is offset relative to the NFET layer.

Reference 491 indicates a device edge for PU2 40-2, and reference 492 indicates a device edge of the PD2 50-2. The PFET device of PU2 40-2 and the NFET device of PD 50-2 may be offset in a relative position, as shown on FIG. 5. Turning to FIG. 5, this figure illustrates an example where the PFET layer 480 overlaps the NFET layer 405 and is offset relative to the NFET layer 405. The offset between layers is illustrated by reference 505. This illustrates a single cell 401. This also illustrates why reference is made to a "long cell", as with both the NFET layer 405 and the PFET layer 480 being stacked on each other, and with both layers being laid out in a vertical direction, the length of the cell

401 along the long axis 501 is multiple times the length of the cell 401 along the short axis 502.

The NFET layer 405 has edges in the horizontal axis corresponding to the edges 515-1 and 515-2 of the BL 20-1 and BLB 20-2 regions. In the vertical axis, edge 520-1 bisects the BL region 20-2, and edge 520-2 bisects the BLB region 20-2. For the PFET layer 480, this has edges 530-1 and 530-2 corresponding to the VDD region 70 in the horizontal axis. In the vertical axis, edge 540-1 bisects the BL region 20-2, and edge 540-2 bisects the BLB region 20-2.

The NFET and PFET device edges can be offset in a relative position, as illustrated by reference 491 indicating a device edge for the PFET PU2 40-2, and reference 492 indicating a device edge of the NFET PD2 50-2. That is, along a vertical axis, the device edges 491 and 492 are offset as indicated by an amount 510 and they are offset relative to each other in the vertical axis.

FIG. 6 illustrates a cross-section of the stacked long cell nanosheet SRAM, where the cross-section is indicated by reference line 495 in FIG. 4. FIG. 6 illustrates part of a semiconductor wafer 600, comprising two cells 401-1 and 401-2 of a stacked long cell nanosheet SRAM. The NFET layer 405 is formed on a substrate 610, and the PFET layer 480 is formed on the NFET layer 405. The PFET pullup transistors 40-1 are on the PFET layer 480, and the NFET pull down transistors 50-1 are on the NFET layer 405. A backside of the wafer 600 is indicated by reference 698, and a frontside of the wafer 600 is indicated by reference 697. It is noted that other layers, which are not shown in this figure, are possible, such as those housing the backside connections from block 485 (toward the backside 698) or the frontside connection(s) from block 486 (toward the frontside 697). It is further noted that the offset 510 between the device edges is shown, this being an offset in the vertical axis between an outer edge of the sidewall material 640 of the PFET 40-1 and an outer edge of the sidewall material 640 of the NFET 50-1. Note that reference 510 is shown in two different locations, both of which are between outer edges of sidewall material 640

The layers 615 may be isolation layers. Reference 630 illustrates a patterned, stacked nanosheet comprising a layer 640 of an insulator (such as low k SiN) that performs electrical isolation, layers of gate material 635, and layers semiconductor material 650 comprised of silicon that is used as nanosheet channel layers. Layers 635 and 650 are alternative. As is known, "low K" refers to a material with a small relative dielectric constant (the "K") relative to silicon dioxide. Material 620 may be $SiO_2$ or another insulator and may be formed via a conformal process.

Both NFET layer 405 and the PFET layer 480 are layers that form their constituent transistors, and may be formed using multiple other layers. For instance, both of these use a patterned nanosheet 630 and a coating layer of material 620, which may be considered to be a layer at least to the extent it provides a region between the NFET layer 405 and the PFET layer 480.

This example has a minimum pitch P-P 660, which can vary in nanometers (nm) depending on the pitch of the constituent components, and the minimum pitch 660 is between lines 601 and 602. The minimum pitch 660 includes the following: a width 606 of 10-30 nm for gate material 635 on a right side of the channel region 611; a width 605 of 10-200 nm of channel region 611 having the layers 650 in the patterned nanosheet 630; a width 604 of 5-15 nm for the gate material 635 on the left side of the channel region 611; a width 603 of 10-20 nm between the side edge of the gate material 635 for the cell 401-2 and a side edge of the gate material 635 for the cell 401-1. For the width 606, this gate material 635 is formed as part of a gate-to-gate connection 612 that connects to the channel region 211 of the NFET pull down transistor 50-1, thereby coupling the gate region 110 of the pullup transistor 40-1 to the gate region 110 of the pull down transistor 50-1. That is, the gate-to-gate connection 612 provides an electrical connection between FETs (NFET and PFET) on two levels.

The width 603 of 10-20 nm includes the insulators 640 and the insulator 620, and indicates an isolation width of the PFET device. The device's active region corresponds to widths 604, 605, and 606. It noted that the NFET 50-1 could have similar widths, within manufacturing tolerances, at least for some embodiments. The term "about" may therefore be used, as the widths 603, 604, 605, and 606 could be slightly different than indicated due to manufacturing tolerances. Such tolerances can be quantified for a given technology.

FIG. 6 also illustrates pitch 461 of a single transistor of an NFET, in this case PD1 50-1, where another example of pitch 461 was illustrated in FIG. 4. It is assumed that pitch 461 can be equivalent to pitch 660.

The example in FIG. 6 uses gate material 635 to couple the gate regions 110 between the PFET pullup transistors 40-1 and the NFET pull down transistors 50-1. Another example is illustrated in FIG. 7, where instead of using gate material 635, contact metal 710 is implemented for the gate-to-gate connections 612, to couple and electrically connect the gate regions 110 (and gate material 635 on the right side of the gate) of the PFET pull up transistors 40-1 to the gate regions 110 (and gate material 635 on the top side of the gate) of the NFET pull down transistors 50-1.

The minimum pitch 660 in this example is similar to the minimum pitch in FIG. 6, so only the differences are described here. The width 608 of 10-12 nm includes the insulator 640 and the insulator 620, and indicates an isolation width of the PFET device. The gate material 635 has symmetrical widths 604 and 609 on both sides of the channel region 611, which can have a range of 5-15 nm. The width 613 of the gate-to-gate connections may have a range of 5-15 nm. The minimum pitch 660 in this example is shown, and may be slightly larger than the minimum pitch 660 in FIG. 6. Further, the minimum pitch 660 in FIG. 7 can have a range that may be affected by manufacturing tolerances. The device's active region corresponds to widths 604, 605, 609, and 613.

Turning to FIG. 8, this figure illustrates an intermixing of cells (bitcells) 401 with logic standard cells 801. There are four cells (bitcells) 401-1, 401-2, 401-3, and 401-4, which are assumed to be similar to or the same as the cells previously described. Each cell (bitcell) 401 stores a single bit. Two logic standard cells 801-1 and 801-2 are shown, and this example lists these and NAND2 cells that are standard cell logic, e.g., basically a "packaged" cell, where each cell 801 has two NAND gates. Reference 810 indicates that there can be an intermixing of cells (bitcells) 401 with logic standard cells 801 in the same circuit row without any interface gap. In particular, by matching the cell heights H (and optionally the widths W) between logic and memory, the cells can be intermixed.

Referring to FIG. 9, which is spread over FIGS. 9A and 9B, this figure is a flowchart of a method for forming a stacked layer memory. In block 905, a first layer of the memory is formed, wherein the first layer comprises a plurality of transistors of a first type. In block 910, s second layer of the memory is formed. The second layer comprises a plurality of transistors of a second type. The first and second layers are different layers and are formed to be stacked vertically. A width of the stacked layer memory is defined at least by a pitch of a single transistor of the transistors of the first type and the transistors of the second type. Additional examples are as follows.

In block 915, a bit line is formed so that a length of the bit line for multiple cells is equal to the pitch of the single transistor multiplied by a total number of the multiple cells. See the description above in relation to FIG. 4 and reference 461.

In block 920, the second layer is formed to be stacked on top of the first layer relative to a backside of a wafer upon which the first and second layers are formed. Block 925 is an example that builds on block 920. Block 925 involves performing a self-aligned gate-to-gate process to form and align gate-to-gate connections between the gates of transistors of the first layer and the gates of transistors of the second layer.

For block 930, widths of individual ones of the plurality of transistors of the first type are different from widths of individual ones of the plurality of transistors of the second type.

For block 935, the stacked layer memory is formed in a standard circuit row also including a plurality of logic cells, wherein there is no interface gap formed between any stacked nanosheet memory and any logic cells of the plurality of logic cells. See also FIG. 8 and corresponding text.

Block 940 involves forming the stacked layer memory as SRAM. SRAM is one example, and other memories may use similar stacked layers. Blocks 945 and 950 further define block 940. Block 945 involves forming a second layer to comprise first and second cross-couple connections (see reference 11 of the previous figures). Block 950 connects BL, BLB and GND to the backside of the wafer, see also block 486 of FIG. 4. Block 955 can depend from block 950 or from the general method (blocks 905 and 910). In block 955, the VDD (power) line is connected to the frontside of the wafer. See also block 486 of FIG. 4.

In block 960, a length of a cell along a long axis of the cell is multiple times a length of the cell along a short axis of the cell. This is one exemplary description of a "long cell".

In block 965, pitch is equivalent to a width of an active region and an isolation width. For block 970, the first type is n-type, and the second type is p-type.

Block 975 forms a stacked nanosheet memory, e.g., by forming and patterning a nanosheet and via other operations known to those skilled in the area. Block 980 further defines block 975 and entails forming the BL (and possibly the BLB) to run perpendicular to orientation of the patterned nanosheet. See, e.g., FIG. 4 and also FIG. 6 for the nanosheet.

Block 985 involves forming a stacked fin-type FET memory. The steps for forming fin-type FET memory may include forming the first layer comprising forming the plurality of transistors of the first type as fin-type field-effect transistors of the first type, and forming the second layer comprising forming the plurality of transistors of the second type as fin-type field-effect transistors of the second type. Forming fin-type FETs is well known to those skilled in this area.

Block 990 involves forming edges of active regions for first and second layers to be offset. See FIGS. 5 and 6 for other description regarding this.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The following abbreviations that may be found in the specification and/or the drawing figures are defined as follows:

6T six-transistor
BL bit line
BLB bit line inverse or inverse bit line
FET field-effect transistor
FinFET fin-type field-effect transistor
PD pulldown PFET p-type FET
PG pass gate
PU pullup
M3 third metal layer
NFET n-type FET
S/D source/drain
SRAM static random-access memory
WL word line

What is claimed is:

1. A stacked layer memory for a static random-access memory, comprising:
a first layer of the static random-access memory, wherein the first layer comprises a plurality of transistors of a first type;
a second layer of the static random-access memory, wherein the second layer comprises a plurality of transistors of a second type, and the first and second layers are different layers stacked vertically; and
wherein a width of individual static random-access memory cells of the stacked layer memory is defined at least by a pitch of a single transistor of the plurality of transistors of the first type and the plurality of transistors of the second type.

2. The stacked layer memory of claim 1, wherein the stacked layer memory comprises a stacked nanosheet memory, the plurality of transistors of the first type having channel regions comprising patterned portions of the stacked nanosheet memory, and the plurality of transistors of the second type having channel regions comprising patterned portions of the stacked nanosheet memory.

3. The stacked layer memory of claim 2, wherein:
a first set of the plurality of transistors of the first type and a second set of the plurality of transistors of the second type form a static random-access memory cell in the static random-access memory;
the first and second sets are stacked vertically;
a bit line is connected to two of the transistors of the first type; and
the bit line runs perpendicular to an orientation of patterned portions of the nanosheet forming active regions of the plurality of transistors of the first type.

4. The stacked layer memory of claim 1, wherein the stacked layer memory comprises a stacked fin-type field-effect transistor memory, the plurality of transistors of the first type are fin-type field-effect transistors of the first type, and the plurality of transistors of the second type are fin-type field-effect transistors of the second type.

5. The stacked layer memory of claim 1, wherein:
a first set of the plurality of transistors of the first type and a second set of the plurality of transistors of the second type form a static random-access memory cell in the static random-access memory;
the first and second sets are stacked vertically;
there are multiple static random-access memory cells in the stacked layer memory formed in a circuit row; and
cell width for individual ones of the multiple static random-access memory cells is equal to the pitch of the single transistor.

6. The stacked layer memory of claim 1, wherein the second layer is stacked on top of the first layer relative to a backside of a wafer upon which the first and second layers are formed.

7. The stacked layer memory of claim 1, wherein widths of individual ones of the plurality of transistors of the first type are different from widths of individual ones of the plurality of transistors of the second type.

8. The stacked layer memory of claim 1, wherein the stacked layer memory has a plurality of static random-access memory cells in the static random-access memory and is included in a standard circuit row, the standard circuit row also includes a plurality of logic cells, and the logic cells and the static random-access memory cells are adjacent and have equivalent cell height.

9. The stacked layer memory of claim 1, wherein the plurality of transistors of the first type for a static random-access memory cell of the static random-access memory comprise four transistors of an n-type, and the plurality of transistors of the second type for the static random-access memory cell comprise two transistors of a p-type.

10. The stacked layer memory of claim 9, wherein for a static random-access memory cell of the static random-access memory, the static random-access memory cell comprises a six-transistor static random-access memory cell having two stacked layers that are one pitch wide.

11. The stacked layer memory of claim 9, wherein the memory is formed as part of a semiconductor wafer, and wherein for a static random-access memory cell of the static random-access memory:
the four transistors of the n-type are two pass gate transistors and two pulldown transistors;
the two transistors of the p-type are pull up transistors;
a bit line is coupled to a source/drain region of a first one of the four transistors;
an inverse bit line is coupled to a source/drain region of a second one of the four transistors;
a ground line is coupled to source/drain regions of the remaining two of the four transistors; and
the bit line, the inverse bit line, and the ground line are connected to a backside of the semiconductor wafer.

12. The stacked layer memory of claim 11, wherein a power line is coupled to source/drain regions of the two transistors, and the power line is connected to a frontside of the semiconductor wafer.

13. The stacked layer memory of claim 1, wherein:
a first set of the plurality of transistors of the first type and a second set of the plurality of transistors of the second type form a static random-access memory cell of the static random-access memory;
the first and second sets are stacked vertically; and
a length of the static random-access memory cell along a long axis of the static random-access memory cell is multiple times a length of the static random-access memory cell along a short axis of the static random-access memory cell.

14. The stacked nanosheet memory of claim 1, wherein the pitch of the single transistor has a value equivalent to a width of an active region of the single transistor and an isolation width of the single transistor, the isolation width from an edge of one side of the active region of the single transistor to an edge of a closest side of an active region of an adjacent transistor.

15. The stacked nanosheet memory of claim 1, wherein the transistors of the first type comprise n-type field effect transistors, and wherein the transistors of the second type comprise p-type field effect transistors.

16. The stacked layer memory of claim 1, wherein:
a first set of the plurality of transistors of the first type and a second set of the plurality of transistors of the second type form a static random-access memory cell of the static random-access memory;
the first and second sets are stacked vertically; and edges of active regions for stacked transistors of the first and second type are offset relative to each other in a vertical axis through a long axis of the static random-access memory cell.

17. A method for forming a stacked layer memory for a static random-access memory, comprising:
   forming a first layer of the static random-access memory, wherein the first layer comprises a plurality of transistors of a first type;
   forming a second layer of the static random-access memory, wherein the second layer comprises a plurality of transistors of a second type, wherein the first and second layers are different layers and are formed to be stacked vertically; and
   wherein a width of individual static random-access memory cells of the stacked layer memory is defined at least by a pitch of a single transistor of the plurality of transistors of the first type and the plurality of transistors of the second type.

18. The method of claim 17, wherein forming the first and second layers comprises forming and patterning a nanosheet so the stacked layer memory comprises a stacked nanosheet memory, the plurality of transistors of the first type having channel regions comprising patterned portions of the stacked nanosheet memory, and the plurality of transistors of the second type having channel regions comprising patterned portions of the stacked nanosheet memory.

19. The method of claim 18, wherein:
   a first set of the plurality of transistors of the first type and a second set of the plurality of transistors of the second type form a static random-access memory cell of the static random-access memory;
   the first and second sets are stacked vertically;
   the forming the first layer comprises forming a bit line connected to two of the transistors of the first type; and
   forming the bit line to run perpendicular to an orientation of patterned portions of the stacked nanosheet memory forming active regions of the plurality of transistors of the first type.

20. The method of claim 17, wherein the stacked layer memory comprises a stacked fin-type field-effect transistor memory, the forming the first layer comprises forming the plurality of transistors of the first type as fin-type field-effect transistors of the first type, and the forming the second layer comprise forming the plurality of transistors of the second type as fin-type field-effect transistors of the second type.

* * * * *